(12) United States Patent
Chiba

(10) Patent No.: US 7,549,101 B2
(45) Date of Patent: Jun. 16, 2009

(54) CLOCK TRANSFERRING APPARATUS, AND TESTING APPARATUS

(75) Inventor: Noriaki Chiba, Tokyo (JP)

(73) Assignee: Advantest Corporation, Tokyo (JP)

( * ) Notice: Subject to any disclaimer, the term of this patent is extended or adjusted under 35 U.S.C. 154(b) by 256 days.

(21) Appl. No.: 11/502,748

(22) Filed: Aug. 11, 2006

(65) Prior Publication Data

US 2007/0025487 A1 Feb. 1, 2007

Related U.S. Application Data

(63) Continuation of application No. PCT/JP2006/305979, filed on Mar. 24, 2006.

(30) Foreign Application Priority Data

Mar. 28, 2005 (JP) ............................. 2005-093022

(51) Int. Cl.
 *G01R 31/28* (2006.01)
(52) U.S. Cl. .................. 714/744; 714/707; 714/715; 714/724; 714/731; 714/738; 714/814; 702/69; 702/117; 713/400; 713/500; 324/765; 375/371
(58) Field of Classification Search .................. None
See application file for complete search history.

(56) References Cited

U.S. PATENT DOCUMENTS

| | | | | |
|---|---|---|---|---|
| 5,619,509 A | * | 4/1997 | Maruyama et al. | 714/707 |
| 5,651,014 A | * | 7/1997 | Kobayashi | 714/744 |
| 6,032,282 A | * | 2/2000 | Masuda et al. | 714/744 |
| 6,279,090 B1 | * | 8/2001 | Manning | 711/167 |
| 2004/0143406 A1 | * | 7/2004 | Nishikobara et al. | 702/69 |
| 2004/0207436 A1 | * | 10/2004 | Suda et al. | 327/105 |
| 2004/0239310 A1 | * | 12/2004 | Oshima et al. | 324/158.1 |
| 2004/0252802 A1 | * | 12/2004 | Yamaguchi | 375/371 |
| 2005/0258856 A1 | * | 11/2005 | Kishimoto et al. | 324/765 |
| 2006/0031689 A1 | * | 2/2006 | Yang et al. | 713/300 |

FOREIGN PATENT DOCUMENTS

| | | |
|---|---|---|
| JP | 3-219739 | 9/1991 |
| JP | 7-312591 | 11/1995 |

* cited by examiner

*Primary Examiner*—John P Trimmings
(74) *Attorney, Agent, or Firm*—Osha • Liang LLP

(57) ABSTRACT

There is provided a clock transferring apparatus for synchronizing a pattern signal synchronized with a reference clock with a variable clock based on an oscillation source different from that of the reference clock, having a rate clock generating section for generating a rate clock whose number of pulses within a predetermined period is almost equal with a number of pulses of the variable clock within the predetermined period by thinning out the pulses within the reference clock, a pattern generating section for generating the pattern signal corresponding to the pulses of the rate clock and a FIFO memory that stores data of the pattern signal corresponding to the pulses of the rate clock and outputs the stored data corresponding to the pulses of the variable clock.

9 Claims, 7 Drawing Sheets

CLOCK TRANSFERRING APPARATUS, AND TESTING APPARATUS

CROSS REFERENCE TO RELATED APPLICATION

This is a continuation application of PCT/JP2006/305979 filed on Mar. 24, 2006 which claims priority from a Japanese Patent Application(s) NO. 2005-093022 filed on Mar. 28, 2005, the contents of which are incorporated herein by reference.

BACKGROUND

1. Field of the Invention

The present invention relates to a clock transferring apparatus for synchronizing a pattern signal with a variable clock that is oscillated based on an oscillation source different from that of the pattern signal and to a test apparatus having such clock transferring apparatus.

2. Related Art

As a test apparatus for testing a device-under-test such as a semiconductor circuit, there has been known a test apparatus that injects jitter to a test signal that is to be supplied to the device-under-test and measures a value of jitter that disables the device-under-test to normally operate. While the test apparatus generates the test signal based on a reference clock, there have been known a method of injecting jitter to the reference clock and a method of injecting jitter to the generated test signal in injecting jitter to the test signal.

FIG. 1 is a diagram for explaining a conventional test apparatus 200, wherein FIG. 1A shows a configuration of the test apparatus 200 that injects jitter to the reference clock and FIG. 1B shows a configuration of the test apparatus 200 that injects jitter to the test signal. The test apparatus 200 shown in FIG. 1A has a reference clock generating section 202, a pattern generating section 204 and a variable delay circuit 206. The reference clock generating section 202 generates the reference clock having an almost same period with that of the test signal that is to be applied to the device-under-test DUT and supplies it to each component of the test apparatus 200.

The pattern generating section 204 generates the test signal to be applied to the device-under-test DUT corresponding to the given reference clock. That is, it generates pulses of the test signal corresponding to pulses of the given reference clock. Therefore, it is possible to generate the test signal having a desirable period by controlling the period of the reference clock. The test apparatus 200 injects jitter to the test signal by generating the reference clock to which the jitter has been injected in the reference clock generating section 202. The variable delay circuit 206 controls the test signal so as to have a desirable phase and applies it to the device-under-test DUT.

The test apparatus 200 shown in FIG. 1 B has a reference clock generating section 208, a pattern generating section 204, a coarse delay section 210, a variable delay circuit 206 and an adding section 212. The reference clock generating section 208 generates a reference clock having a preset period and the pattern generating section 204 generates the test signal corresponding to the given reference clock. The coarse delay section 210 and the variable delay circuit 206 delay respective pulses of the test signal to control the period and phase of the test signal. The coarse delay section 210 delays integer times of the period of the reference clock among values of delay of the respective pulses of the test signal to be delayed and the variable delay circuit 206 delays by a value smaller than period of the reference clock among the values of delay. The adding section 212 accumulatively adds differences of the period of the test signal and the period of the reference clock to control the value of delay of the variable delay circuit 206. The test apparatus 200 injects jitter to the test signal by providing a voltage fluctuating circuit at an output end or by controlling the value of delay of the variable delay circuit 206. The applicant is presently unaware of related patent documents, so that their description will be omitted here.

However, it is difficult to design timing of the test apparatus 200 shown in FIG. 1A because the period of the reference clock supplied to each component is variable. That is, because the period of the reference clock given as an operating clock fluctuates, it is necessary to design the timing of each component so that they can operate at each period of the reference clock. Still more, it becomes more difficult to design the timing because the reference clock to which the jitter has been injected is supplied to each component.

Still more, while the test apparatus 200 shown in FIG. 1B injects jitter to the test signal by the voltage fluctuating circuit or the like, it is difficult to inject accurate jitter as compared to the case of injecting jitter in the reference clock generating section 208.

SUMMARY

Accordingly, it is an object of some aspects of the invention to provide a clock transferring apparatus and a test apparatus, which are capable of solving the above-mentioned problems. This object may be achieved through the combination of features described in independent claims of the invention. Dependent claims thereof specify preferable embodiments of the invention.

That is, according to a first aspect of the invention, there is provided a clock transferring apparatus for synchronizing a pattern signal synchronized with a reference clock with a variable clock based on an oscillation source different from that of the reference clock, having a rate clock generating section for generating a rate clock whose number of pulses within a predetermined period is almost equal with a number of pulses of the variable clock within the predetermined period by thinning out the pulses within the reference clock, a pattern generating section for generating the pattern signal corresponding to the pulses of the rate clock and a FIFO memory that stores data of the pattern signal corresponding to the pulses of the rate clock and outputs the stored data corresponding to the pulses of the variable clock.

The clock transferring apparatus may further include a time difference absorbing section for causing the FIFO memory not to output the stored data until when the pattern signal is supplied to the FIFO memory and causing the FIFO memory to output the stored data after when the pattern signal is supplied to the FIFO memory.

The clock transferring apparatus may further include a variable clock generating section for generating the variable clock and a start timing control section for supplying a start signal for causing the rate clock generating section and the variable clock generating section to start to output the rate clock and the variable clock and the time difference absorbing section may control time when the FIFO memory starts to output the data based on a differential time between a first period of time until when the rate clock is supplied to the FIFO memory from when the rate clock generating section receives the start signal and a second period of time until the variable clock is supplied to the FIFO memory from when the variable clock generating section receives the start signal.

The time difference absorbing section may have a division section that receives information on the difference of time between the first period of time and the second period of time and divides the differential time information by a period of the variable clock and a FIFO control section that counts a number of pulses of the given variable clock and when a count value coincides with a value obtained by reckoning a decimal point or less of a result of division in the division section as a unit, starts to output the data stored in the FIFO memory. The clock transferring apparatus may further include a jitter injecting section for injecting jitter to the variable clock generated by the variable clock generating section.

The variable clock generating section may include a voltage controlled oscillator for generating the variable clock, a frequency divider for dividing the variable clock, a phase comparator for detecting a phase difference between the variable clock divided by the divider and a given comparative clock and a charge pump for generating control voltage corresponding to the phase difference detected by the phase comparator to control frequency of the variable clock generated by the voltage controlled oscillator, wherein the jitter injecting section injects jitter to the variable clock by superimposing the jitter to the phase difference detected by the phase comparator or to the control voltage generated by the charge pump.

The clock transferring apparatus may further include a phase control section for superimposing a phase control signal for controlling phase of the pattern signal outputted out of the FIFO memory to the phase difference detected by the phase comparator or to the control voltage generated by the charge pump. The variable clock generating section may further includes an adder for adding the jitter signal and the phase control signal and a superimposer for superimposing a signal outputted out of the adder to the phase difference or the control voltage.

According to a second aspect of the invention, there is provided a test apparatus for testing a device-under-test, having a reference clock generating section for generating a reference clock, a first test module for generating a first test signal having a period different from that of the reference clock to supply to the device-under-test and a second test module for generating a second test signal synchronized with the reference clock to supply to the device-under-test, wherein the first test module has a variable clock generating section for generating a variable clock having a period different from that of the reference clock, a rate clock generating section for generating a rate clock whose number of pulses within a predetermined period of time is equal with a number of pulses of the variable clock within the predetermined period of time, a pattern generating section for generating a pattern signal corresponding to the pulses of the rate clock and a FIFO memory for storing data of the pattern signal corresponding to the pulses of the rate clock and outputting the stored data as the first test signal corresponding to the pulses of the variable clock.

It is noted that the summary of the invention described above does not necessarily describe all necessary features of the invention. The invention may also be a sub-combination of the features described above.

BRIEF DESCRIPTION OF THE DRAWINGS

FIG. 1 is a diagram for explaining a conventional test apparatus 200, wherein

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1A:
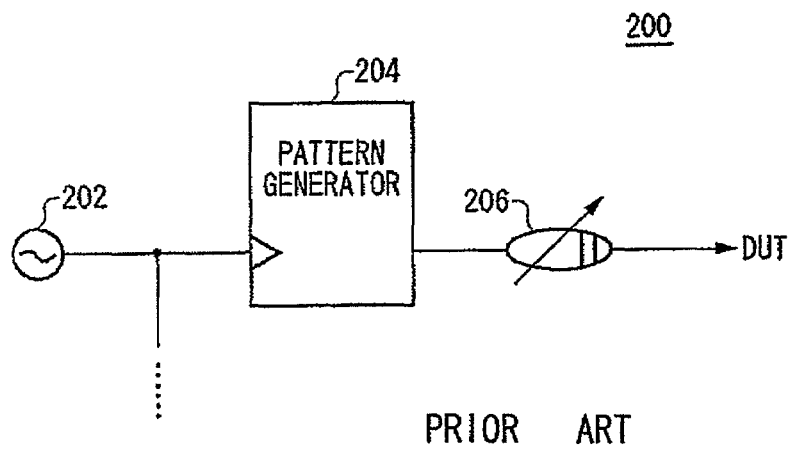
FIG. 1A shows a configuration of the test apparatus 200 that injects jitter to a reference clock and FIG. 1B shows a configuration of the test apparatus 200 that injects jitter to a test signal.
Figure 1B:
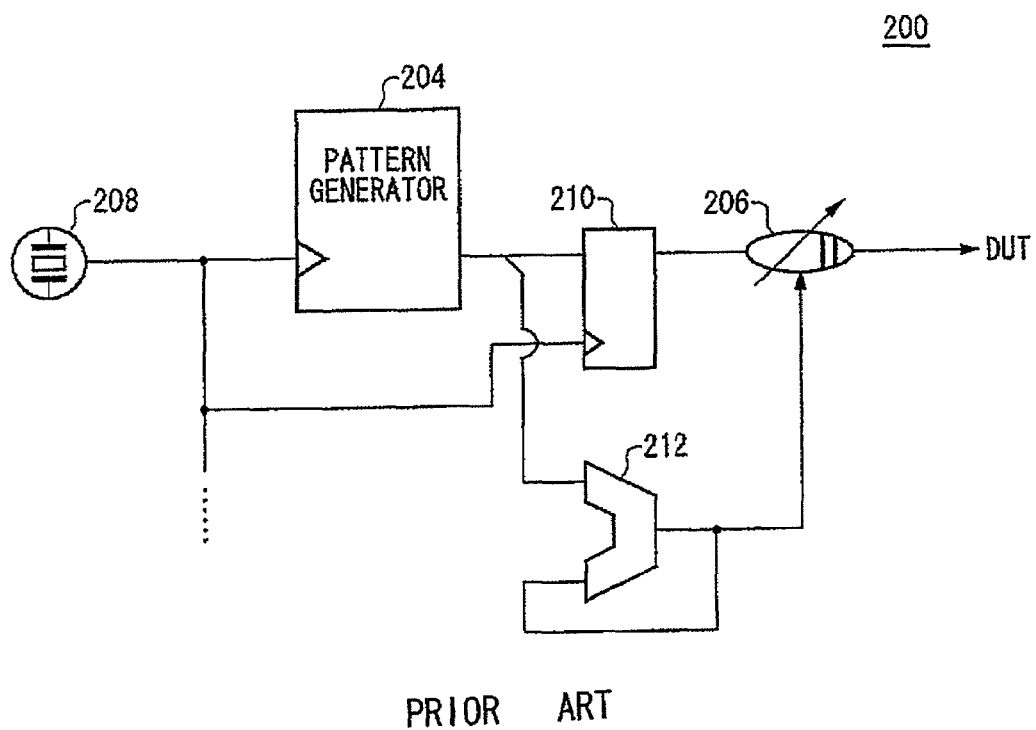
Figure 2:
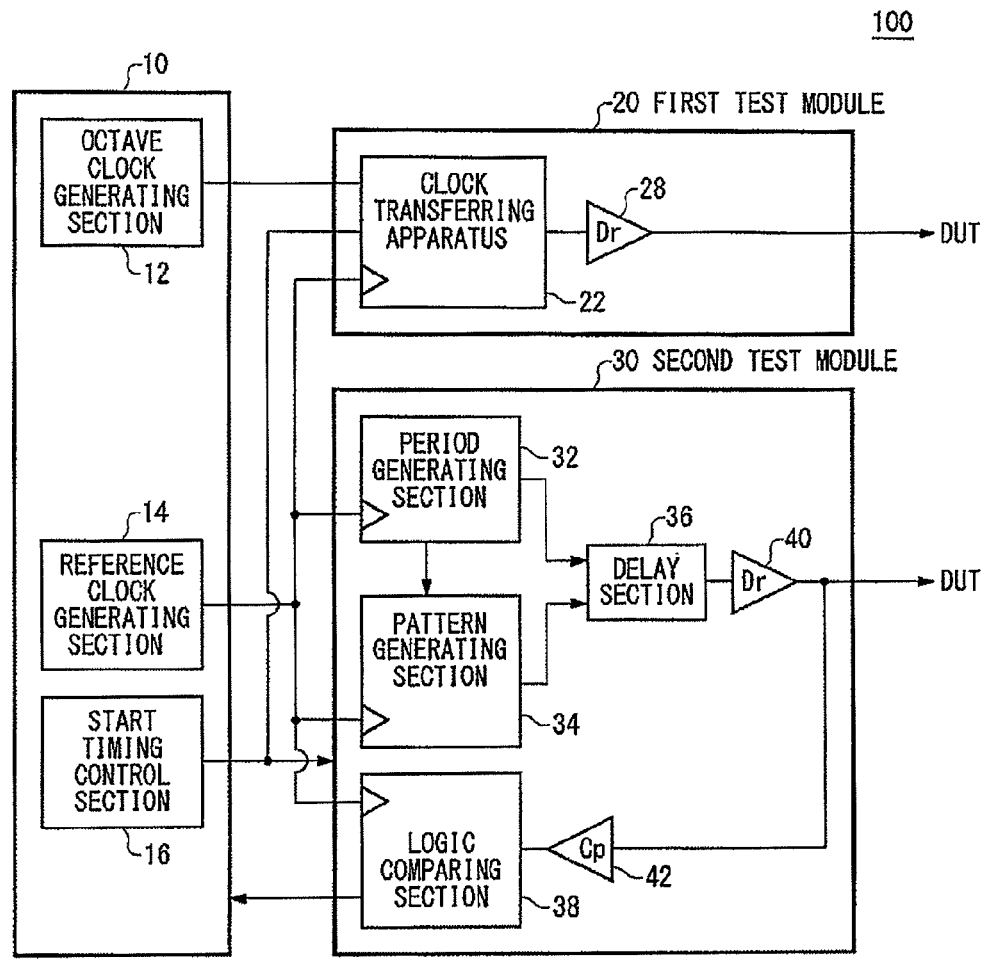
FIG. 2 is a diagram showing one exemplary configuration of a test apparatus 100 according to an embodiment of the invention.

FIG. 2 is a diagram showing one exemplary configuration of a test apparatus 100 according to an embodiment of the invention. The test apparatus 100 is an apparatus for testing a device-under-test DUT such as a semiconductor circuit and has a body section 10, a first test module 20 and a second test module 30. Although the test apparatus 100 has the two test modules in this example, the test apparatus 100 may have a large number of test modules corresponding a number of input/output pins of the device-under-test DUT in another example.

The body section 10 controls the first and second test modules 20 and 30. The body section 10 has a reference clock generating section 14, an octave clock generating section 12 and a start timing control section 16. The reference clock generating section 14 generates reference clock having predetermined frequency that specifies operating frequency of the first and second test modules 20 and 30. The octave clock generating section 12 has a clock oscillation source different from that of the reference clock generating section 14 and generates octave clock whose frequency is variable. The start timing control section 16 generates a start signal that specifies timing for starting the test of the device-under-test DUT. The start signal is a signal that represents logic H during the test from the start timing to the end of the test.

The first test module 20 is a module for testing jitter of the device-under-test DUT for example and is connected with pin of the device-under-test DUT to supply a first test signal into which jitter has been injected to the pin. For example, it is possible to detect a value of jitter that disables the device-under-test DUT to normally operate by gradually increasing the amount of jitter to be applied to the first test signal. It is then possible to judge whether or not the device-under-test DUT normally operate by comparing an output signal of the device-under-test DUT detected by another test module with an expected value set in advance.

The first test module 20 has a clock transferring apparatus 22 and a driver 28. The clock transferring apparatus 22 generates the first test signal synchronized with variable clock based on an oscillation source different from that of the reference clock and supplies it to the device-under-test DUT via the driver 28.

The second test module 30 is a module for implementing functional tests of the device-under-test DUT for example and is connected with another pin of the device-under-test DUT to supply a second test signal having a desirable pattern to the pin. For example, it implements the functional test of the device-under-test DUT by supplying the second test signal to the device-under-test DUT so that it operates in a predetermined manner and by comparing an output signal of the device-under-test DUT and an expected value set in advance.

The second test module 30 has a period generating section 32, a pattern generating section 34, a delay section 36, a logic comparing section 38, a driver 40 and a receiver 42. These components receive the reference clock and operate correspondingly to respective pulses of the reference clock.

The period generating section 32 generates a periodic signal that specifies a period of the second test signal. The pattern generating section 34 generates a pattern signal representing a pattern of the second test signal corresponding to the given periodic signal. The delay section 36 generates the second test signal by receiving the pattern signal and by delaying respective pulses of the pattern signal. The driver 40 supplies the second test signal to the device-under-test DUT. The receiver 42 receives an output signal of the device-under-test DUT and supplies it to the logic comparing section 38. The logic comparing section 38 compares the output signal of the device-under-test DUT with the expected value to judge whether or not the device-under-test DUT is defect-free. The pattern generating section 34 may generate the expected value. The body section 10 stores results of the judgment of the logic comparing section 38.

Such configuration allows the jitter test and functional test of the device-under-test DUT to be concurrently carried out. The first test module 20 and the second test module 30 may test the same and one device-under-test DUT or may test different device-under-test DUT.

Figure 3:
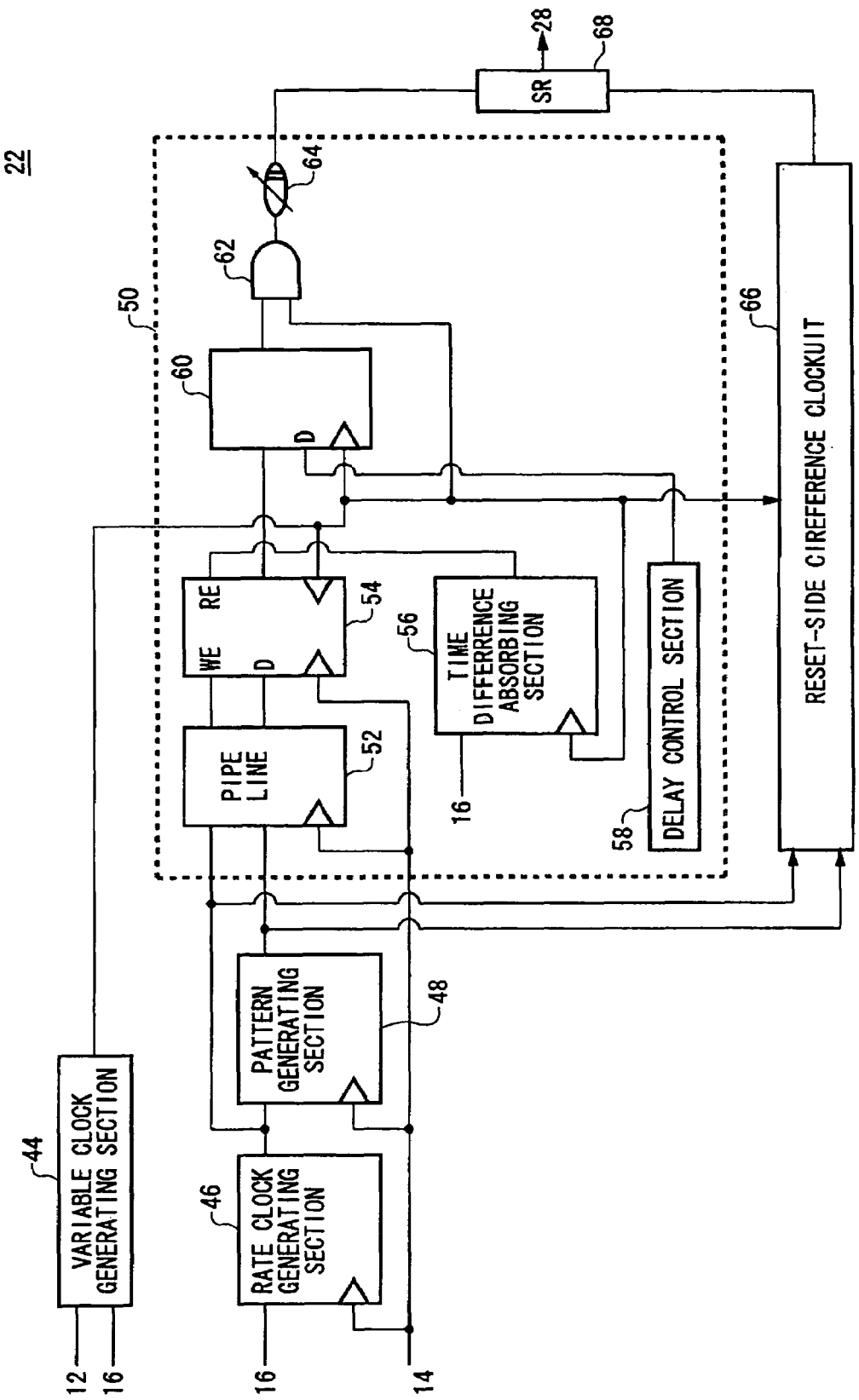
FIG. 3 is a diagram showing one exemplary configuration of a clock transferring apparatus 22.

FIG. 3 is a diagram showing one exemplary configuration of the clock transferring apparatus 22. The clock transferring apparatus 22 has a variable clock generating section 44, a rate clock generating section 46, a pattern generating section 48, a set-side circuit 50, a reset-side circuit 66 and a set/reset latch 68.

The variable clock generating section 44 generates the variable clock based on the octave clock given from the octave clock generating section 12. The variable clock generating section 44 outputs the variable clock after receiving the start signal from the start timing control section 16. The variable clock generating section 44 also outputs the variable clock by injecting jitter of an amplitude set in advance. The variable clock generating section 44 is a PLL circuit for example that generates variable clock of desirable frequency. The variable clock generating section 44 generates the variable clock having an almost same period with the period of the first test signal to be supplied to the device-under-test DUT in this example.

The rate clock generating section 46 generates a rate clock whose number of pulses within a predetermined period is almost equal with a number of pulses of the variable clock within the predetermined period by thinning the pulses of the given reference clock. The rate clock generating section 46 also outputs the rate clock after receiving the start signal from the start timing control section 16. In this example, the rate clock generating section 46 generates the rate clock whose average frequency becomes almost equal with a test frequency set in advance and the variable clock generating section 44 generates the variable clock having almost equal frequency with the test frequency. The test frequency may be set in advance in the rate clock generating section 46 and the variable clock generating section 44.

The pattern generating section 48 generates the pattern signal representing the pattern of the first test signal corresponding to the pulses of the rate clock outputted out of the rate clock generating section 46. The pattern signal is a signal in which data values of 1 and 0 are arrayed for example. The pattern generating section 48 may store the pattern of the first test signal in advance. In this example, the pattern generating section 48 receives the reference clock as an operating clock and the rate clock as an enable signal. The pattern generating section 48 outputs the pattern signal corresponding to the pulses of the rate clock in such configuration.

The set-side circuit 50 synchronizes the pattern signal given in synchronism with the rate clock with the variable clock and supplies it to a set terminal of the set/reset latch 68. The reset-side circuit 66 has the same configuration with the set-side circuit 50. It synchronizes the pattern signal with the variable clock and supplies it to a reset terminal of the set/reset latch 68. The pattern generating section 48 may supply the same pattern signal to the set-side circuit 50 and the reset-side circuit 66 or may generate different pattern signals to supply to the set-side circuit 50 and the reset-side circuit 66. The set/reset latch 68 generates the first test signal based on the signals given from the set-side circuit 50 and the reset-side circuit 66.

The set-side circuit 50 and the reset-side circuit 66 have a 52, a FIFO memory 54, a time difference absorbing section 56, a delay control section 58, a coarse delay section 60, a AND circuit 62 and a variable delay circuit 64, respectively. The pipeline 52 receives the pattern signal and the rate clock and supplies them to the FIFO memory 54 corresponding to the reference clock. It then operates the set-side circuit 50 and the reset-side circuit 66 in synchronism. The pipeline 52 is a flip-flop connected in series for example.

The FIFO (First In First Out) memory 54 stores data of the given pattern signal corresponding to pulses of the rate clock and outputs the stored data corresponding to pulses of the variable clock. The FIFO memory 54 is a memory that outputs the stored data from what has been stored first. In this example, the FIFO memory 54 receives the reference clock as operating clock for storing data and receives the rate clock at a write enable terminal WE. The FIFO memory 54 stores the given data corresponding to the reference clock when it receives a signal of logic H at the write enable terminal WE. Through such configuration, the FIFO memory 54 stores the data of the pattern signal corresponding to the pulses of the rate clock.

The FIFO memory 54 also receives the variable clock as operating clock in outputting data and receives a signal given from the time difference absorbing section 56 at a read enable terminal RE. When the FIFO memory 54 receives a signal logic H at the read enable terminal RE, it outputs the data stored first corresponding to the variable clock. The FIFO memory 54 outputs the stored data corresponding to the pulses of the variable clock through such configuration.

Because a number of pulses of the variable clock and that of the rate clock within a predetermined period are almost equal in the clock transferring apparatus 22 of the present embodiment, a number of data stored by the FIFO memory 54 within the predetermined period is almost equal with a number of data outputted out of the FIFO memory 54 within the predetermined period. Therefore, the FIFO memory 54 can output the pattern signal synchronized with the variable clock without overflowing data to be stored in the FIFO memory 54 and without lacking data to be stored in the FIFO memory 54.

The rate clock and the pattern signal are transmitted to the FIFO memory 54 via the pipe line 52 and others, so that a first period of time from when the rate clock generating section 46 receives the start signal until when the rate clock is supplied to the FIFO memory 54 is different from a second period of time from when the variable clock generating section 44 receives the start signal until when the variable clock is supplied to the FIFO memory 54. The time difference absorbing section 56 controls the FIFO memory 54 or the pipe line 52 so as to eliminate a difference of timing between the timing when the data is inputted to the FIFO memory 54 and the timing when the FIFO memory 54 outputs the data.

When the first period of time is longer than second period of time for example, the time difference absorbing section 56 controls the FIFO memory 54 so as not to output the data until when the pattern signal is supplied to the FIFO memory 54 and so as to output the data after when the pattern signal is supplied to the FIFO memory 54. In the present embodiment, the time difference absorbing section 56 controls time when the FIFO memory 54 starts to output the data by supplying a read enable signal for controlling whether or not to read data to the FIFO memory 54. When the first period of time is shorter than second period of time, the time difference absorbing section 56 absorbs the difference of time by controlling delay time in the pipeline 52.

The coarse delay section 60 and the variable delay circuit 64 receive the data outputted out of the FIFO memory 54 and delay the data so as to have desirable phase. The coarse delay section 60 delays the data by a value of delay of integer times of the period of the variable clock. In the present embodiment, the coarse delay section 60 counts the pulses of the variable clock and outputs the data received from the FIFO memory 54 when the counted value coincides with a preset value given from the delay control section 58. The variable delay circuit 64 delays the data by a value of delay smaller than period of the variable clock. The delay control section 58 controls the values of delay in the coarse delay section 60 and the variable delay circuit 64.

The clock transferring apparatus 22 of the present embodiment facilitates the design of timing because the rate clock generating section 46, the pattern generating section 48 and others operate based on the reference clock having a constant period regardless of the period of the test signal to be generated and the amount of jitter to be injected to the test signal. It also allows highly accurate jitter to be readily injected because it can inject the jitter by controlling the phase of the variable clock.

Figure 4:
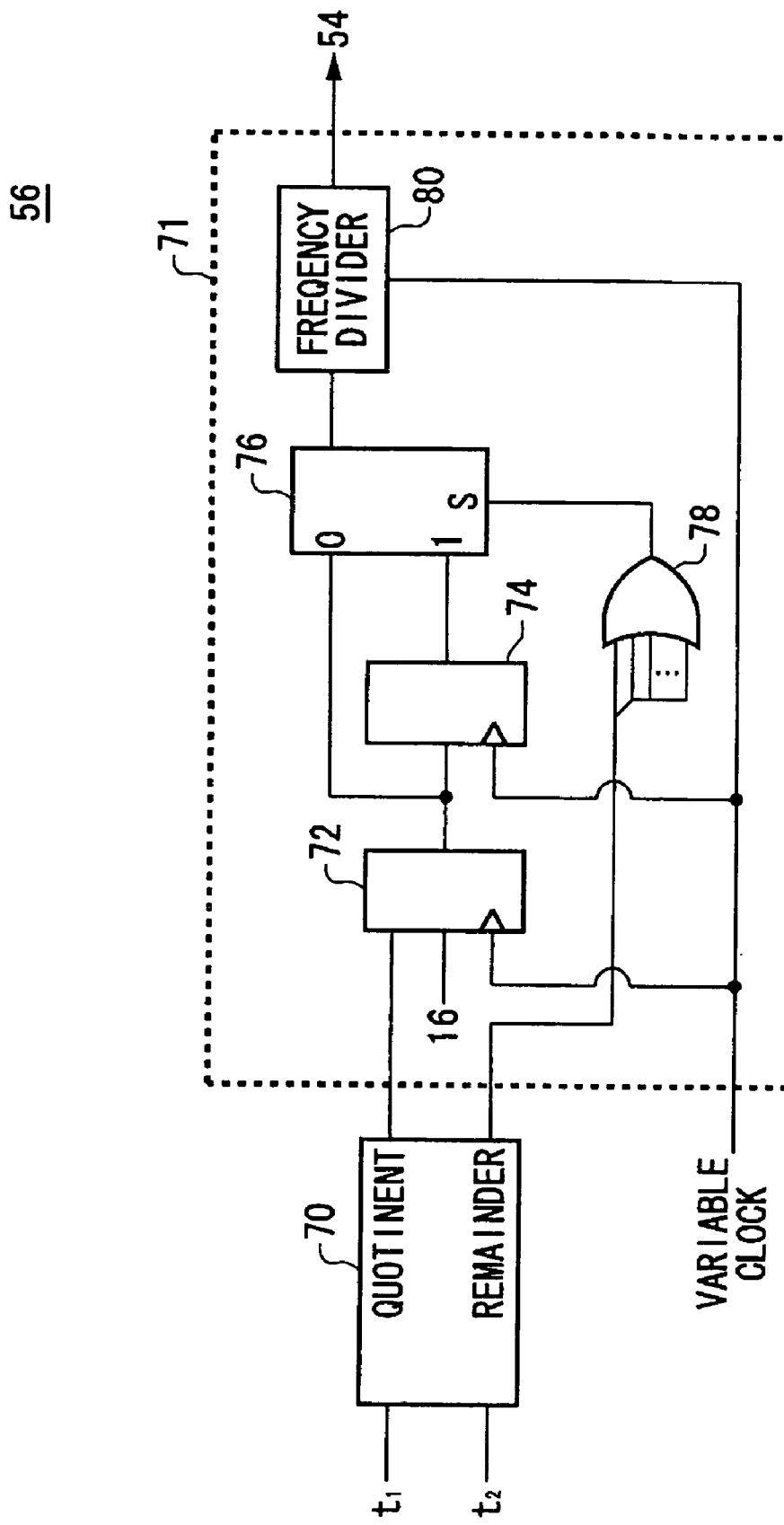
FIG. 4 is a diagram showing one exemplary configuration of a time difference absorbing section 56.

FIG. 4 is a diagram showing one exemplary configuration of the time difference absorbing section 56. The time difference absorbing section 56 has a division section 70 and a FIFO control section 71. The FIFO control section 71 further includes a counter 72, a flip-flop 74, an OR circuit 78, a selecting section 76 and a frequency divider 80.

Differential time information t1 representing the difference between the first period of time from when the rate clock generating section 46 receives the start signal until when the rate clock is supplied to the FIFO memory 54 and the second period of time from when the variable clock generating section 44 receives the start signal until when the variable clock is supplied to the FIFO memory 54 and periodic information t2 representing the period of the variable clock are given to the division section 70. The case when the first period of time is longer than second period of time will be explained here. The division section 70 divides the differential time information t1 by the periodic information t2 and outputs obtained quotient and remainder, respectively. In the present embodiment, the quotient and the remainder are outputted as binary digital signals. It is noted that although the differential time information t1 and the periodic information t2 shown in FIG. 4 are not shown in FIG. 3, they may be information given to the time difference absorbing section 56. A user may set this information in advance or the test apparatus 100 may generate them based on a program or the like set by the user.

When the FIFO control section 71 receives the start signal from the start timing control section 16, it counts a number of pulses of the given variable clock. Then, when a counted value coincides with a value obtained by reckoning a number under a decimal point of the result of division in the division section 70, the FIFO memory 54 starts to output the stored data.

The counter 72 starts to count the number of pulses of the variable clock when it receives the start signal from the start timing control section 16 and outputs the pulses when the counted value coincides with a quotient received from the division section 70. The flip-flop 74 also outputs the pulses outputted out of the counter 72 by delaying by one period of the variable clock. The OR circuit 78 outputs OR of each bit of the remainder outputted out of the division section 70. That is, the OR circuit 78 outputs 1, except of a case when the remainder outputted out of the division section 70 is zero.

When the OR circuit 78 outputs 0, the selecting section 76 passes the pulses outputted out of the counter 72 and when the OR circuit 78 outputs 1, passes the pulses outputted out of the flip-flop 74. The frequency divider 80 divides the pulse received via the selecting section 76 and outputs it to the FIFO memory 54 as the read enable signal. The frequency divider 80 divides the pulse by a ratio of division corresponding to a number of cycles of the test signal to be outputted out of the clock transferring apparatus 22. That is, the frequency divider 80 outputs the read enable signal of logic H during a period in which data should be outputted out of the FIFO memory 54 to generate the test signal.

Figure 5:
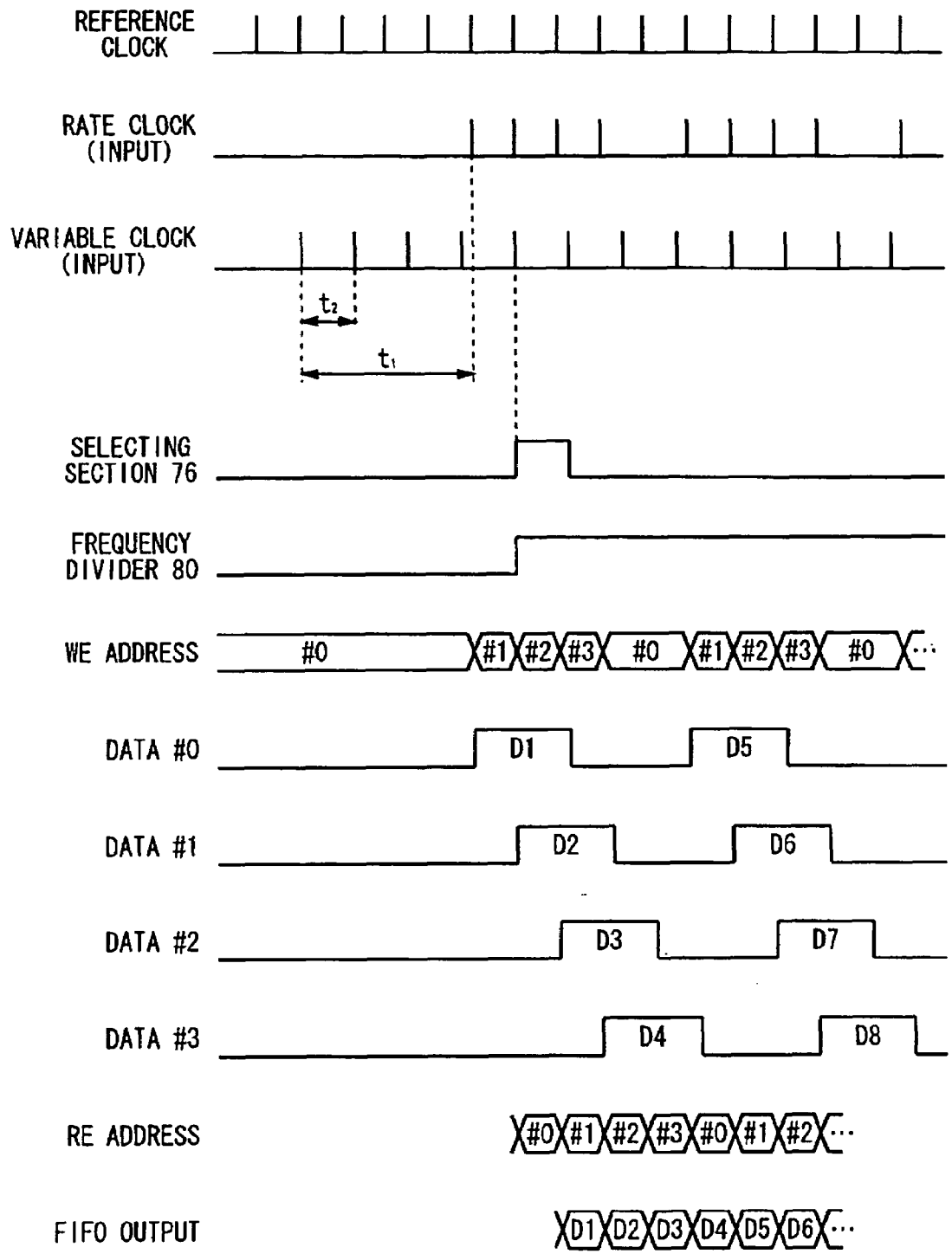
FIG. 5 is a timing chart showing one exemplary operation of the clock transferring apparatus 22.

FIG. 5 is a timing chart showing one exemplary operation of the clock transferring apparatus 22. FIG. 5 shows the rate clock and the variable clock as waveforms inputted to the FIFO memory 54.

There is a lag of differential time t1 between the timing when the rate clock is inputted to the FIFO memory 54 and timing when the variable clock is inputted to the FIFO memory 54 as described above. The time difference absorbing section 56 controls the timing of the read enable signal outputted out of the frequency divider 80 as described above so as to absorb the differential time.

Write enable address (WE address) is given to the FIFO memory 54 in synchronism with the rate clock. In the present embodiment, the FIFO memory 54 has four address regions and the pattern generating section 48 may output data #0 to data #3 corresponding to each address of the FIFO memory 54 in parallel as the pattern signal. The FIFO memory 54 sequentially stores the data corresponding to the address specified by the write enable address.

The FIFO memory 54 also receives read enable address (RE address) synchronized with the variable clock and outputs the stored data to an address specified by the read enable address. When a data value 1 is stored in the address for example, the FIFO memory 54 outputs a pulse of a predetermined pulse width corresponding to the pulse of the variable clock and when a data value 0 is stored in the address, the FIFO memory 54 outputs a signal of logic L.

Figure 6:
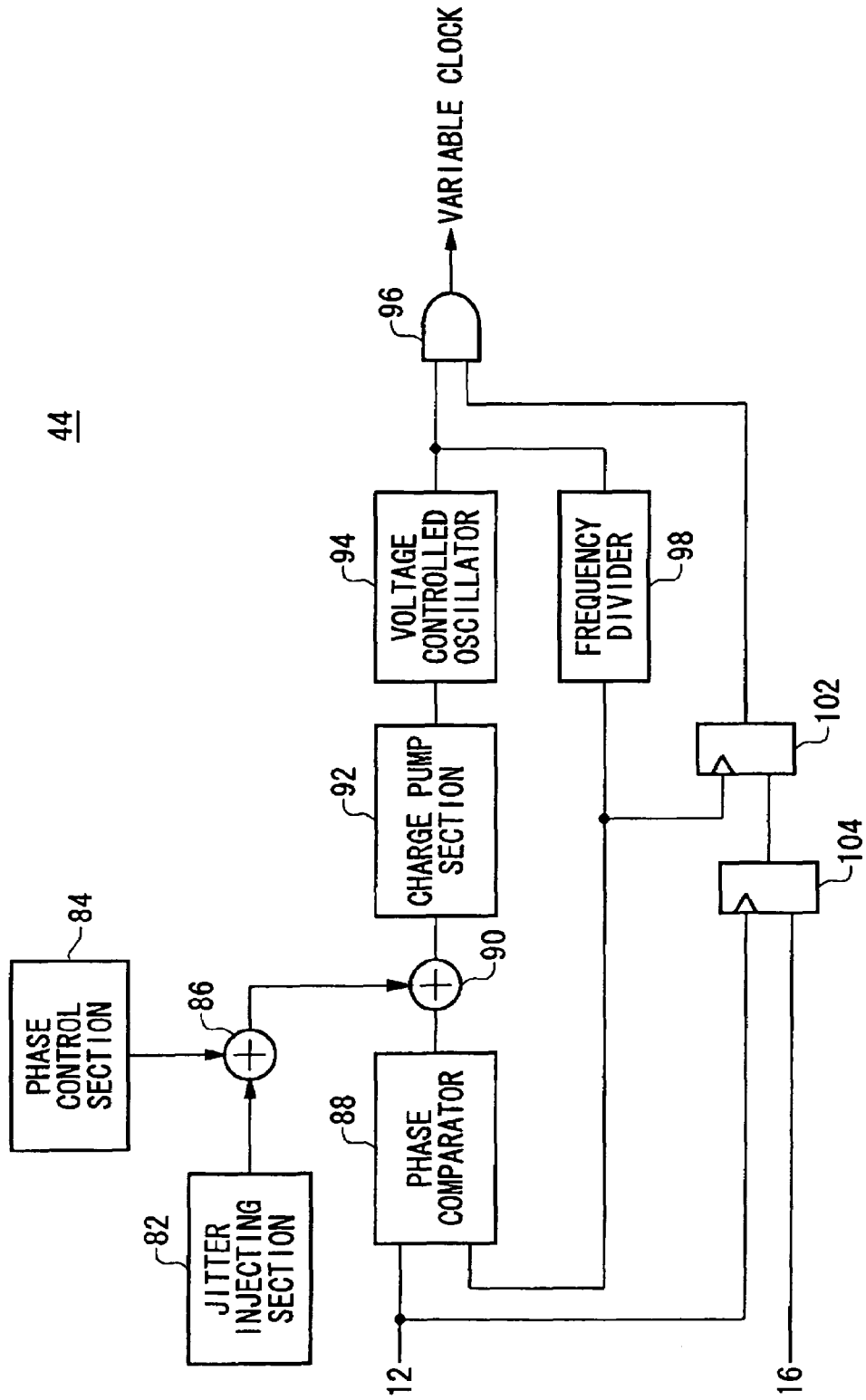
FIG. 6 is a diagram showing one exemplary configuration of a variable clock generating section 44.

FIG. 6 is a diagram showing one exemplary configuration of the variable clock generating section 44. The variable clock generating section 44 is a PLL circuit and has a jitter injecting section 82, an adder 86, a phase comparator 88, a superimposer 90, a charge pump section 92, a voltage controlled oscillator 94, an AND circuit 96, a frequency divider 98, a flip-flop 102 and a flip-flop 104.

The voltage controlled oscillator 94 generates the variable clock. The frequency divider 98 divides the variable clock outputted out of the voltage controlled oscillator 94 and supplies it to the phase comparator 88. The phase comparator 88 receives the octave clock as comparative clock and detects a phase difference between the variable clock divided by the frequency divider 98 and the comparative clock.

The charge pump section 92 generates control voltage corresponding to the phase difference detected by the phase comparator and controls frequency of the variable clock generated by the voltage controlled oscillator 94. The AND circuit 96 receives the start signal via the flip-flops 102 and 104 connected in series and outputs AND of the start signal and the variable clock. That is, the variable clock generating section 44 outputs the variable clock from the timing of start specified by the start signal. The flip-flop 102 receives the signal outputted out of the frequency divider 98 as operating clock and the flip-flop 104 receives the octave clock as operating clock.

The jitter injecting section 82 injects jitter to the variable clock generated by the variable clock generating section 44. For example, the jitter injecting section 82 injects the jitter by fluctuating the frequency of the variable clock generated by the voltage controlled oscillator 94 by superimposing a jitter signal to the phase difference detected by the phase comparator 88 or the control voltage generated by the charge pump section 92. In the present embodiment, the jitter injecting section 82 superimposes a jitter signal to a phase difference signal outputted out of the phase comparator 88 via the adder 86 and the superimposer 90. It becomes possible to inject the highly accurate jitter readily to the variable clock through such configuration.

Still more, the variable clock generating section 44 may further include a phase control section 84 as shown in FIG. 6. The phase control section 84 controls the phase of the pattern signal outputted out of the FIFO memory 54 by further superimposing the phase control signal to the phase difference detected by the phase comparator 88 or the control voltage generated by the charge pump section 92. In this case, the adder 86 adds the jitter signal and the phase control signal. The superimposer 90 also superimposes the signal outputted out of the adder 86 to the phase difference outputted out of the phase comparator 88 or to the control voltage outputted out of the charge pump section 92.

Such configuration allows the phase of the pattern signal outputted out of the FIFO memory 54 to be readily adjusted to desirable phase. It is possible to control the phase of the test signal when the variable clock generating section 44 has the phase control section 84, so that the set-side circuit 50 and the reset-side circuit 66 may not have the coarse delay section 60, the AND circuit 62, the variable delay circuit 64 and the delay control section 58. Thereby, the phase of the test signal may be controlled by the simple configuration.

Figure 7:
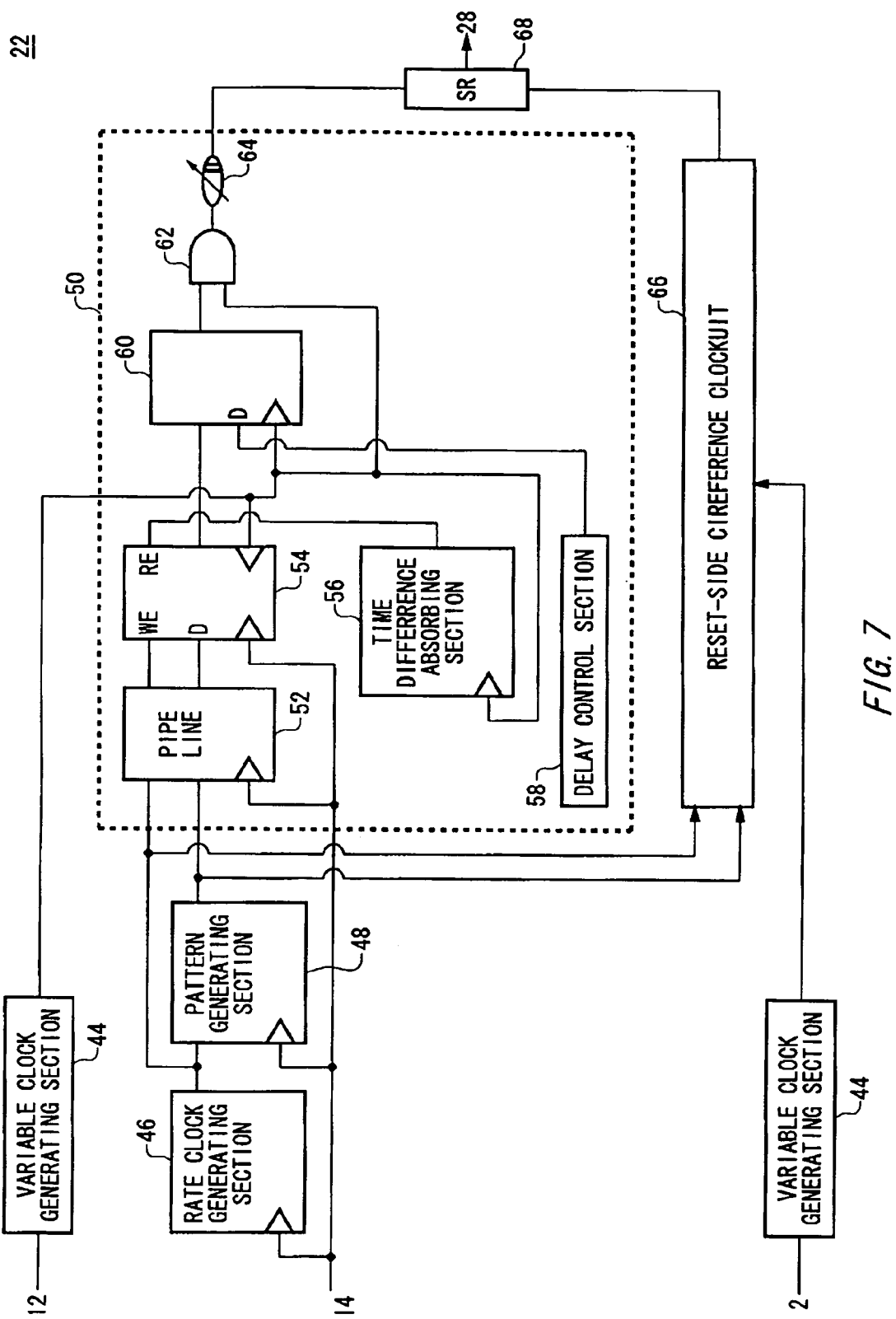
FIG. 7 is a diagram showing another exemplary configuration of the clock transferring apparatus 22.

FIG. 7 is a diagram showing another exemplary configuration of the clock transferring apparatus 22. The clock transferring apparatus 22 in this example is different from the clock transferring apparatus 22 explained in connection with FIG. 3 in that it has two variable clock generating sections 44.

The two variable clock generating sections 44 are provided corresponding to the set-side circuit 50 and the reset-side circuit 66. Each of the variable clock generating sections 44 supplies the variable clock to the corresponding circuit among the set-side circuit 50 and the reset-side circuit 66. Periods of the variable clocks generated by the respective variable clock generating sections 44 are almost equal.

The clock transferring apparatus 22 of the present embodiment can generate the two variable clocks independently corresponding to the set-side circuit 50 and the reset-side circuit 66, so that it can inject different jitters at rising and falling edges of the test signal.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the present invention allows the test signal of desirable period to be generated by the circuit whose design of timing is easy. Still more, it allows the highly accurate jitter to be injected to the test signal by the circuit whose design of timing is easy.

What is claimed is:

1. A clock transferring apparatus for synchronizing a pattern signal synchronized with a reference clock with a variable clock based on an oscillation source different from that of said reference clock, comprising:
   a rate clock generating section for generating a rate clock whose number of pulses within a predetermined period is almost equal with a number of pulses of said variable clock within said predetermined period by thinning out the pulses within said reference clock;
   a pattern generating section for generating said pattern signal corresponding to the pulses of said rate clock; and
   a FIFO memory that stores data of said pattern signal corresponding to the pulses of said rate clock and outputs said stored data corresponding to the pulses of said variable clock.

2. The clock transferring apparatus as set forth in claim 1, further comprising a time difference absorbing section for causing said FIFO memory not to output said stored data until when said pattern signal is supplied to said FIFO memory and causing said FIFO memory to output said stored data after when said pattern signal is supplied to said FIFO memory.

3. The clock transferring apparatus as set forth in claim 2, further comprising
   a variable clock generating section for generating said variable clock; and
   a start timing control section for supplying a start signal for causing said rate clock generating section and said variable clock generating section to start to output said rate clock and said variable clock,
   wherein said time difference absorbing section controls time when said FIFO memory starts to output said data based on a differential time between a first period of time until when said rate clock is supplied to said FIFO memory from when said rate clock generating section receives said start signal and a second period of time until said variable clock is supplied to said FIFO memory from when said variable clock generating section receives said start signal.

4. The clock transferring apparatus as set forth in claim 3, wherein said time difference absorbing section comprises:
   a division section that receives information on difference of time between said first period of time and said second period of time and divides said differential time information by a period of said variable clock; and
   a FIFO control section that counts a number of pulses of said given variable clock and when a count value coincides with a value obtained by rounding a result of division in said division section to the next integer, starts to output said data stored in said FIFO memory.

5. The clock transferring apparatus as set forth in claim 3, further comprising a jitter injecting section for injecting jitter to said variable clock generated by said variable clock generating section.

6. The clock transferring apparatus as set forth in claim 5, wherein said variable clock generating section comprises:
   a voltage controlled oscillator for generating said variable clock;
   a frequency divider for dividing said variable clock;
   a phase comparator for detecting a phase difference between said variable clock divided by said divider and a given comparative clock; and
   a charge pump for generating control voltage corresponding to said phase difference detected by said phase comparator to control frequency of said variable clock generated by said voltage controlled oscillator,
   wherein said jitter injecting section injects jitter to said variable clock by superimposing the jitter to said phase difference detected by said phase comparator or to said control voltage generated by said charge pump.

7. The clock transferring apparatus as set forth in claim 6, further comprising a phase control section for superimposing a phase control signal for controlling phase of said pattern signal outputted out of said FIFO memory to said phase difference detected by said phase comparator or to said control voltage generated by said charge pump.

8. The clock transferring apparatus as set forth in claim 7, wherein said variable clock generating section further comprises:
   an adder for adding said jitter signal and said phase control signal; and
   a superimposer for superimposing a signal outputted out of said adder to said phase difference or said control voltage.

9. A test apparatus for testing a device-under-test, comprising:
   a reference clock generating section for generating a reference clock;
   a first test module for generating a first test signal having a period different from that of said reference clock to supply to said device-under-test; and
   a second test module for generating a second test signal synchronized with said reference clock to supply to said device-under-test,
   wherein said first test module comprises:
   a variable clock generating section for generating a variable clock having a period different from that of said reference clock;
   a rate clock generating section for generating a rate clock whose number of pulses within a predetermined period of time is equal with a number of pulses of said variable clock within said predetermined period of time; a pattern generating section for generating a pattern signal corresponding to the pulses of said rate clock; and
   a FIFO memory for storing data of said pattern signal corresponding to the pulses of said rate clock and outputting said stored data as said first test signal corresponding to the pulses of said variable clock.

\* \* \* \* \*